(12) United States Patent
Chu

(10) Patent No.: US 6,297,108 B1
(45) Date of Patent: Oct. 2, 2001

(54) METHOD OF FORMING A HIGH VOLTAGE MOS TRANSISTOR ON A SEMICONDUCTOR WAFER

(75) Inventor: Tung-Yuan Chu, Tao-Yuan Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/523,594

(22) Filed: Mar. 10, 2000

(51) Int. Cl.⁷ .................................................. H01L 21/336
(52) U.S. Cl. ........................ 438/297; 438/301; 438/529
(58) Field of Search .................................... 438/225, 275, 438/297, 276, 231, 449, 514, 529, 401, 159, 301

(56) References Cited

U.S. PATENT DOCUMENTS

| | | | |
|---|---|---|---|
| 5,300,797 | * 4/1994 | Bryant et al. | 257/206 |
| 5,376,568 | * 12/1994 | Yang | 437/40 |
| 5,786,252 | * 7/1998 | Ludikhuize et al. | 438/275 |
| 5,910,666 | * 6/1999 | Wen | 257/288 |

* cited by examiner

Primary Examiner—Olik Chaudhuri
Assistant Examiner—Kurt Eaton
(74) Attorney, Agent, or Firm—Winston Hsu

(57) ABSTRACT

The present invention provides a method of forming a doped region with a DDD on a semiconductor wafer. The semiconductor wafer comprises a silicon substrate, a pad oxide layer, and a silicon nitride layer that is used to define an active area. A lithographic process is performed to define a position of the DDD. Then a first ion implantation process is performed to implant a specific dosage of dopants into the silicon substrate. The photoresist layer is then removed completely. A thermal oxidation process is performed to form a field oxide layer in the region not covered by the silicon nitride layer, and to simultaneously drive the dopants into the silicon substrate so as to form a doped region. The silicon nitride layer and the pad oxide layer are removed. Then a poly gate and a spacer are formed. A second ion implantation process is performed to implant ions into the silicon substrate so as to form the doped region with a DDD structure in the N-type MOS transistor.

10 Claims, 6 Drawing Sheets

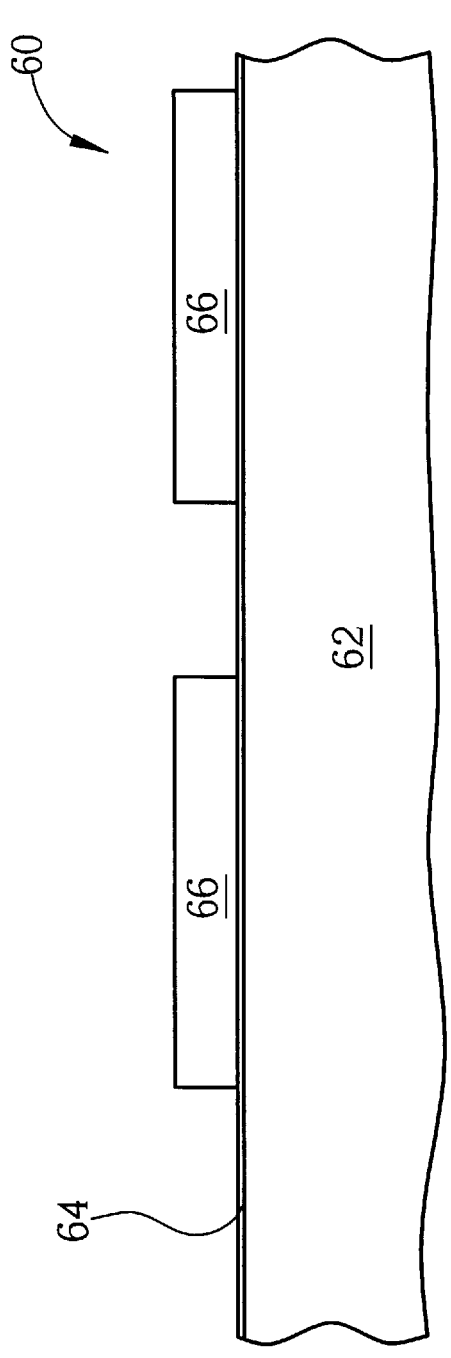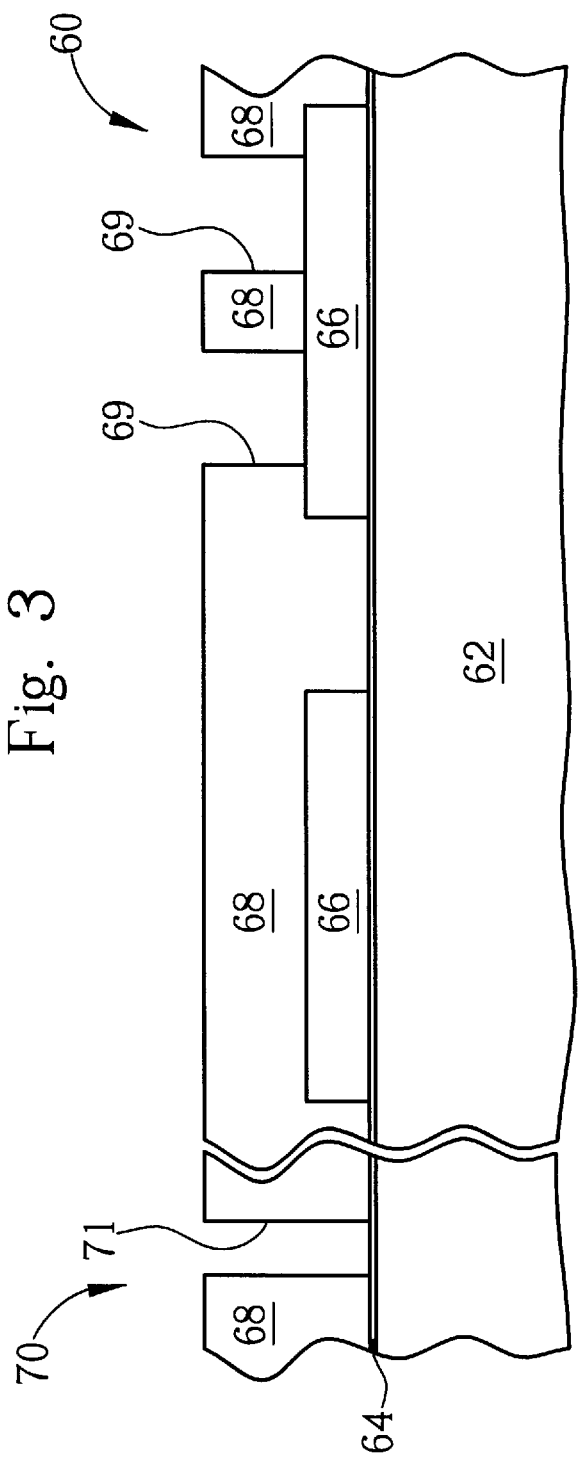

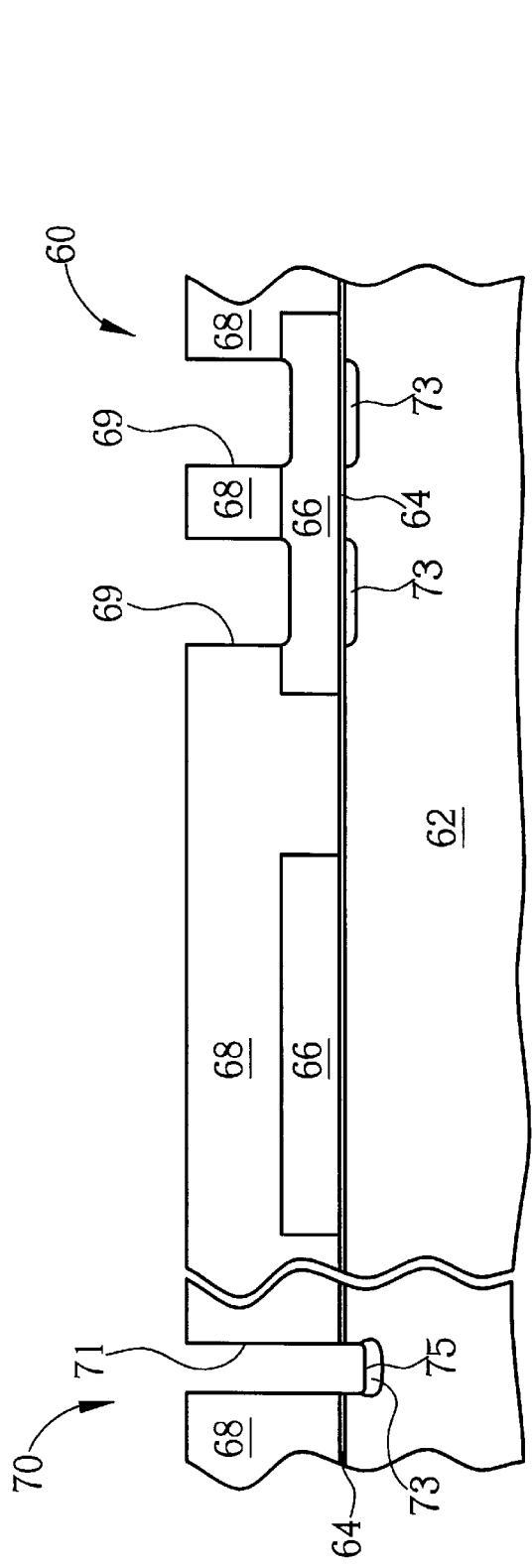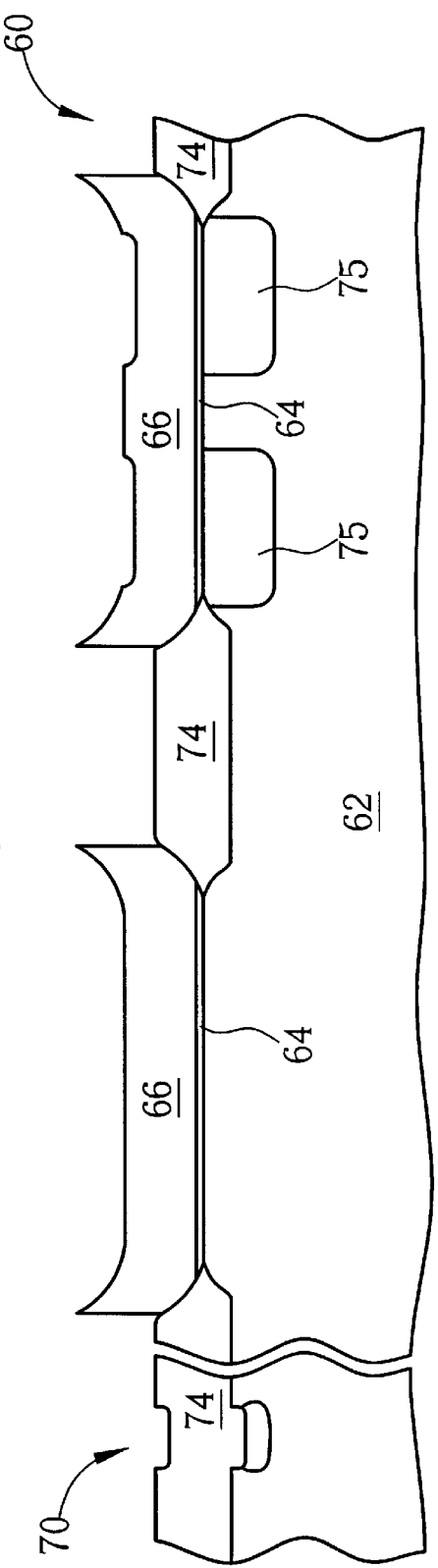

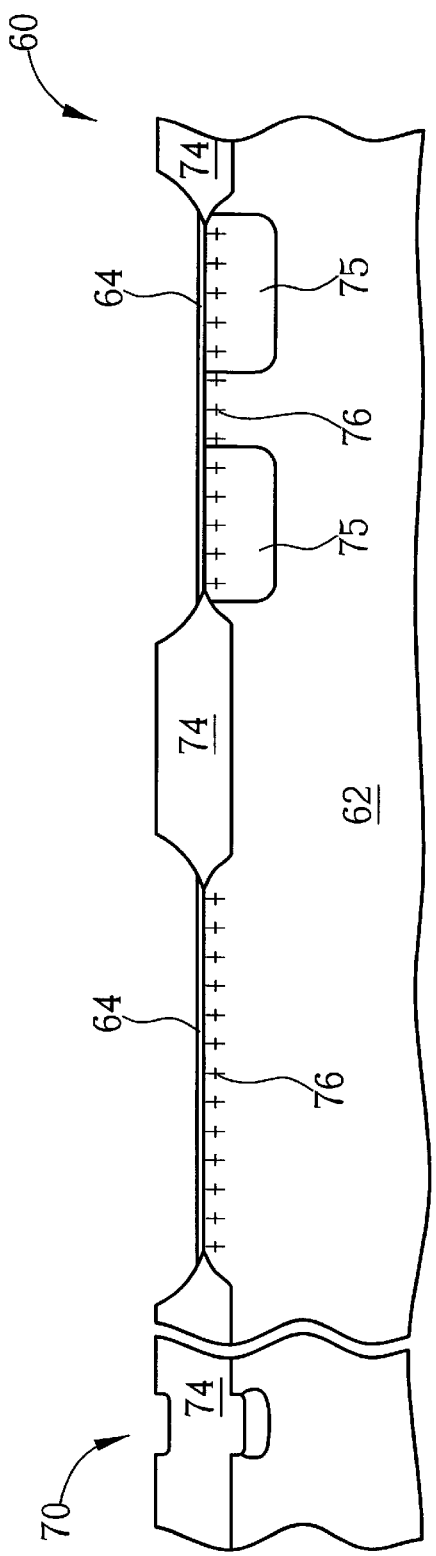
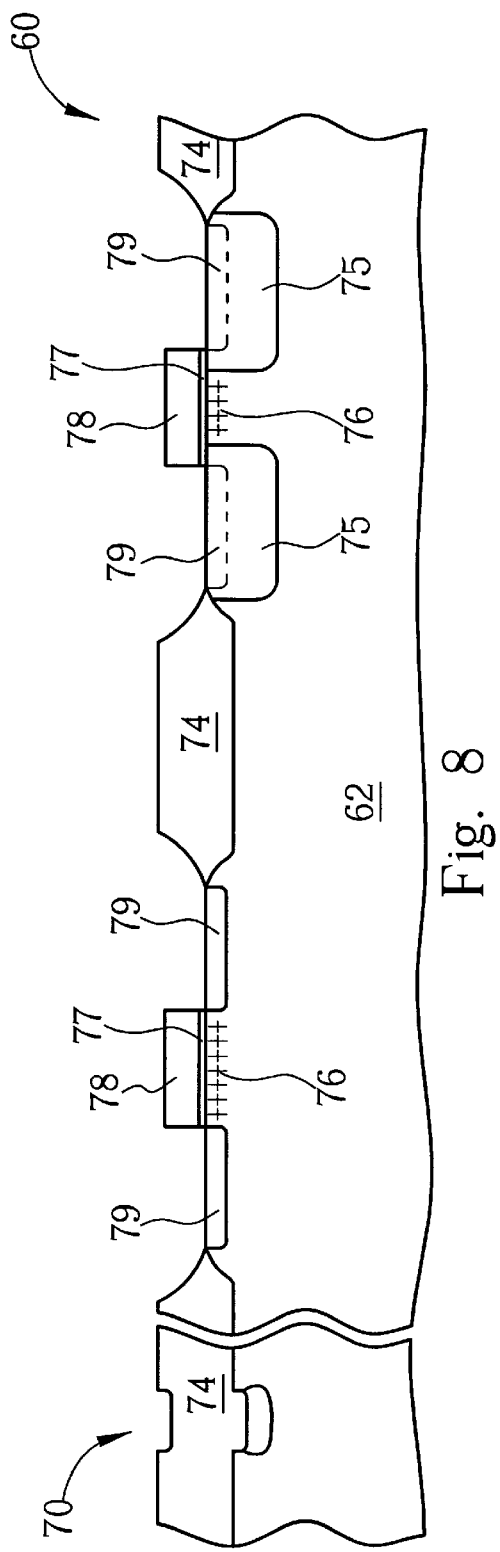

METHOD OF FORMING A HIGH VOLTAGE MOS TRANSISTOR ON A SEMICONDUCTOR WAFER

BACKGROUND OF THE INVENTION

1. Field of the Invention

The present invention relates to a method of forming a doped region on a semiconductor wafer, and more particularly, to a method of forming a doped region with a double diffuse drain (DDD) on a semiconductor wafer.

2. Description of the Prior Art

A double diffuse drain (DDD) is used as a source/drain in a high voltage metal-oxide semiconductor (HVMOS) transistor. It provides a high breakdown voltage for the HVMOS transistor to prevent electrostatic discharge that may result in the destruction of a semiconductor device. It also provides a solution to hot electron effects, which are due to shorted channel lengths in a MOS transistor, and so prevents electrical breakdown in the source/drain under high voltage loading.

However, in a typical semiconductor manufacturing process, a semiconductor wafer not only comprises HVMOS transistors, but also comprises many low voltage metal-oxide semiconductor (LVMOS) transistors. How to integrate the HVMOS transistor process with the LVMOS transistor process, and how to create large amounts of both HVMOS and LVMOS transistors simultaneously on a semiconductor wafer is an important issue at the present time.

Please refer to FIG. 1 and FIG. 2. FIG. 1 and FIG. 2 are cross-sectional diagrams of a method of forming a DDD on an N-type HVMOS transistor according to the prior art. The prior art N-type HVMOS transistor 10 is formed on a predetermined area of a semiconductor wafer 12. The semiconductor wafer 12 comprises a p-type silicon substrate 14, a gate oxide layer 16 positioned on the p-type silicon substrate 14, a poly gate 18 positioned on the gate oxide layer 16, two spacers 20 around the poly gate 18, and two field oxide (FOX) layers 22 positioned adjacent to the two sides of the HVMOS transistor 10. The field oxide layers 22 provides good insulation between the HVMOS transistor 10 and other devices.

As shown in FIG. 1, in the prior art method of forming a source/drain of the DDD in the N-type HVMOS transistor 10, a lithographic process is performed to coat a photoresist layer 24 on the semiconductor wafer 12. Then an exposure process and a development process are performed to form openings 26 in the photoresist layer 24. The openings 26 are used to define a position of the source/drain, and the photoresist layer 24 is used as a mask in a subsequent ion implantation process.

A first ion implantation process is performed with an energy of 50 to 180 KeV to implant $10^{14}$ to $10^{15}$ ions/cm$^2$ of phosphorus ($p^{31}$) ions into a portion of the P-type silicon substrate 14 not covered by the photoresist layer 24, forming a first doped region 28. Then, a second ion implantation process is performed with an energy of 50 to 150 KeV to implant $10^{15}$ to $5 \times 10^{15}$ ions/cm$^2$ of arsenic (As) ions into the same area of the first doped region 28 so as to form a second doped region 30. As show in FIG. 2, a resist stripping process is performed to remove the photoresist layer 24 on the semiconductor wafer 12. A thermal annealing process is performed to drive the phosphorus ions in the first doped region 28 into the silicon substrate 14 so as to form a lightly N doped region 32, and to simultaneously drive the arsenic ions in the second doped region 30 into the silicon substrate 14 so as to form a heavily N$^+$ doped region 34. The doped regions 32 and 34 overlap each other, and a doped region 36 with a double diffuse drain (DDD) is thus formed. The doped region 36 is used as the source/drain in the HVMOS transistor 10. The silicon lattice in the silicon substrate 14, which may have been destroyed by the ion implantation processes, can be restored during a thermal annealing process.

If two doped regions with a DDD in a P-type HVMOS transistor need to be formed, the above steps can still be used, changing only some of the materials or implantation energies. For example, the P-type silicon substrate 14 is first replaced by an N-type silicon substrate. The phosphorus ions in the first implantation process are replaced by boron (B) ions with a new implantation energy of 30 to 70 KeV. The arsenic ions in the second ion implantation process are replaced by BF$_2^+$ ions with a new implantation energy of 50 to 120 KeV. Hence, the source/drain of the DDD in a P-type HVMOS transistor can be formed with the same equipment that is used to form an N-type HVMOS transistor.

However, when HVMOS transistors are formed on the semiconductor wafer, the semiconductor wafer also comprises many LVMOS transistors. The structures of HVMOS transistors and of LVMOS transistors are different, and so the thermal budgets of the processes needed for the formation of the HVMOS transistors and the LVMOS transistors are different, too. The source of the HVMOS transistor usually needs to withstand high breakdown voltages, so the DDD in an HVMOS transistor is formed using a thermal process that has a high temperature and a long treatment period time. However, such a thermal treatment will drive the ions in the doped regions of the LVMOS transistors into the silicon substrate beyond a predetermined depth, resulting in unstable characteristics of the LVMOS transistors. Consequently, it is difficult to integrate the manufacturing processes of HVMOS transistors with those of LVMOS transistors under conditions that maintain the original characteristics of the devices.

SUMMARY OF THE INVENTION

It is therefore a primary objective of the present invention to provide a method of forming a source/drain of a DDD in an HVMOS transistor to solve the above problems.

In a preferred embodiment, the present invention provides a method of forming a doped region on a semiconductor wafer. The semiconductor wafer comprises a silicon substrate, a silicon oxide layer positioned on the silicon substrate, and a silicon nitride layer positioned on a predetermined area of the silicon oxide layer. A lithographic process is performed to form a photoresist layer of even thickness on the semiconductor wafer. The photoresist layer is used as a mask and comprises at least one opening over the silicon nitride layer. A first ion implantation process is performed to implant a specific dosage of dopants into the silicon substrate under the opening. The photoresist layer on the semiconductor wafer is removed completely. A thermal oxidation process is then performed to form a field oxide layer in the region not covered by the silicon nitride layer, and to simultaneously drive the dopants into the silicon substrate so as to form a doped region. The silicon nitride layer on the semiconductor wafer is then removed completely. A poly gate on the substrate in the area between the two doped regions is formed and a spacer around the sides of the poly gate is formed. Then a second ion implantation process is performed to implant a specific dosage of dopants into a predetermined region of the two doped regions so as to form two doped regions each with a double diffuse drain (DDD).

It is an advantage of the present invention that HVMOS transistors and LVMOS transistors can be simultaneously formed on a semiconductor without affecting their original characteristics.

These and other objectives of the present invention will no doubt become obvious to those of ordinary skill in the art after reading the following detailed description of the preferred embodiment which is illustrated in the various figures and drawings.

BRIEF DESCRIPTION OF THE DRAWINGS

FIG. 3 to FIG. 9 are cross-sectional diagrams of a method of forming a DDD doped region on a semiconductor wafer according to the present invention.

DETAILED DESCRIPTION OF THE PREFERRED EMBODIMENT

Figure 1:
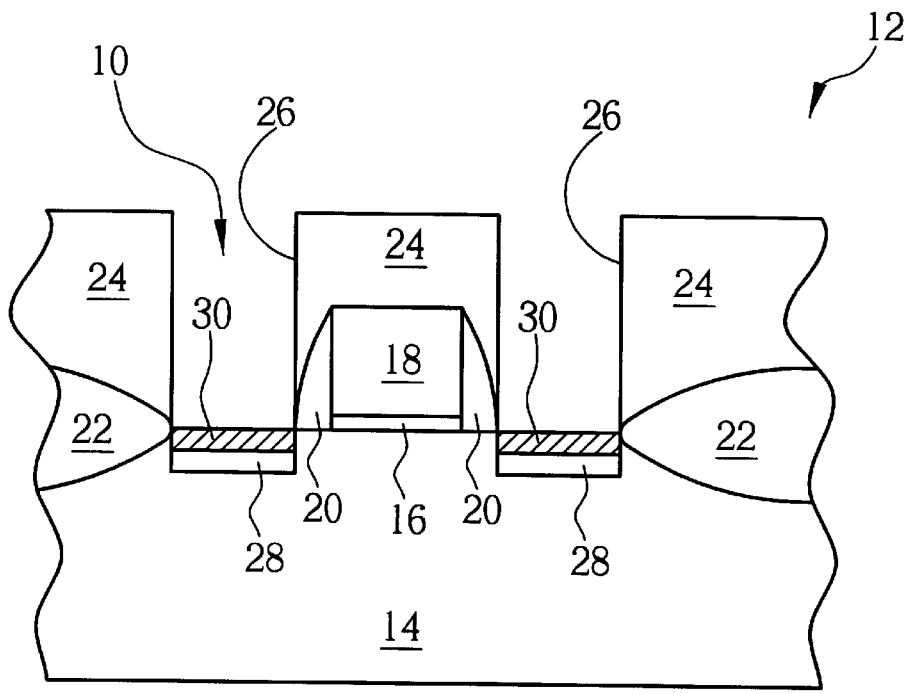
FIG. 1 and FIG. 2 are cross-sectional diagrams of a method of forming a DDD in an N-type HVMOS transistor according to the prior art.
Figure 2:
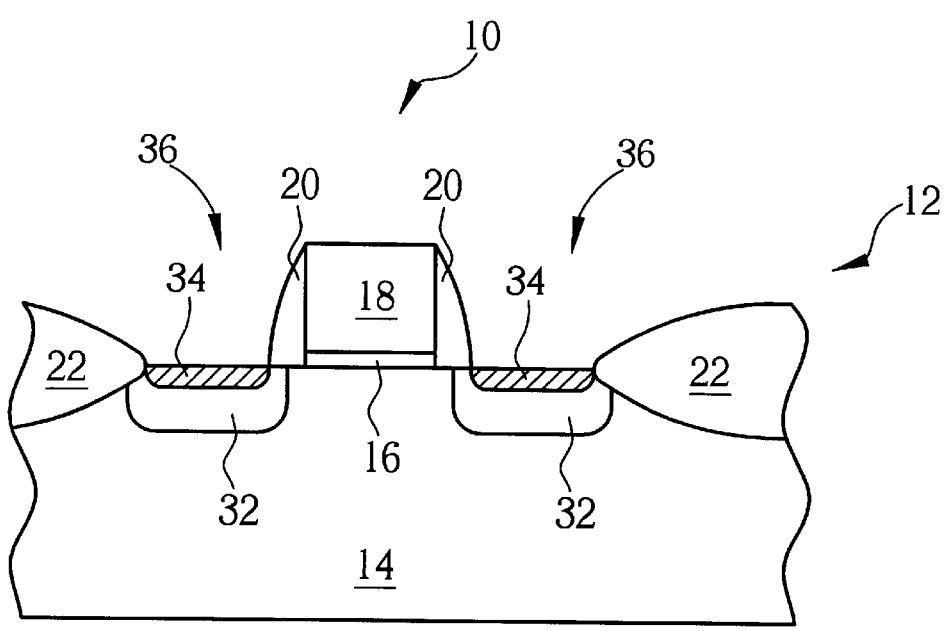

Please refer to FIG. 3 to FIG. 9. FIG. 3 to FIG. 9 are schematic diagrams of a method of forming a DDD doped region on a semiconductor wafer 60 according to the present invention. The present invention provides a method of forming a DDD doped region on a semiconductor wafer 60 while being able to simultaneously form a source/drain of an N-type LVMOS transistor 83 and a source/drain of an N-type HVMOS transistor 84.

As shown in FIG. 3, the semiconductor wafer 60 comprises a P-type silicon substrate 62, a silicon oxide layer 64 of silicon dioxide ($SiO_2$) positioned on the P-type silicon substrate 62 and being used as a pad oxide layer, and a silicon nitride layer (SiN) 66 positioned on a predetermined area of the silicon oxide layer 64 and being used to define an active area on the semiconductor wafer 60.

In the present invention, a photoresist layer 68 is coated on the semiconductor wafer 60. A lithographic process is performed to convert the photoresist layer 68 into a hard mask for a subsequent ion implantation process. As shown in FIG. 4, the photoresist layer 68 is coated on the surface of the silicon oxide layer 64 and the silicon nitride layer 66, and it also covers a scribe line 70 on the semiconductor wafer 60. The photoresist layer 68 comprises two openings 69 positioned over the silicon nitride layer 66 that are used to define the position of the DDD. The photoresist layer 68 also comprises at least one opening 71 positioned on the scribe line 70 that is used to define a position of an alignment mark 72.

As shown in FIG. 5, after the lithographic process is performed, an etching process is performed on the semiconductor wafer 60 through the opening 71 in the photoresist layer 68 to remove the silicon oxide layer 64 and the P-type silicon substrate 62 down to a predetermined depth so as to form a recess at the scribe line 70 on the P-type silicon substrate 62. The recess defines an alignment mark. An ion implantation process is then performed with an energy of 320 KeV to implant $5\times10^{13}$ ions/$cm^3$ of phosphorus ions into the P-type silicon substrate 62 so as to form an N-type doped regions 73. A resist stripping process is then performed to remove the photoresist layer 68 completely.

As shown in FIG. 6, a thermal oxidation process is performed. The semiconductor wafer 60 is heated to 1000 to 1100° C. in the presence of oxygen gas for 30 to 60 minutes so as to form a field oxide layer 74 in the region that is not covered by the silicon nitride layer 66. During the thermal oxidation process, the phosphorus ions will be driven into the P-type silicon substrate 62 to form an $N^-$ doped region 75.

As shown in FIG. 7, the silicon nitride layer 66 on the semiconductor wafer is then removed completely. A threshold voltage adjustment implantation process is performed to form an ion implantation layer 76 on the P-type silicon substrate 62 so as to adjust the threshold voltage of the LVMOS transistor 83. Finally, the silicon oxide layer 64, which is destroyed during ion implantation processes, is removed.

As shown in FIG. 8, after the silicon oxide layer 64 has been removed, a gate oxide layer 77 of silicon dioxide and a poly gate 78 of polysilicon are formed in order on the P-type silicon substrate 62. An ion implantation process is then performed to implant $10^{13}$ ions/$cm^3$ of phosphorus ions into those portions of the P-type silicon substrate 62 that are not covered by the poly gate 78 and the field oxide layer 74 so as to form a lightly doped region 79. The lightly doped region 79 is used as a lightly doped drain (LDD) of the LVMOS transistor 83.

Figure 9:
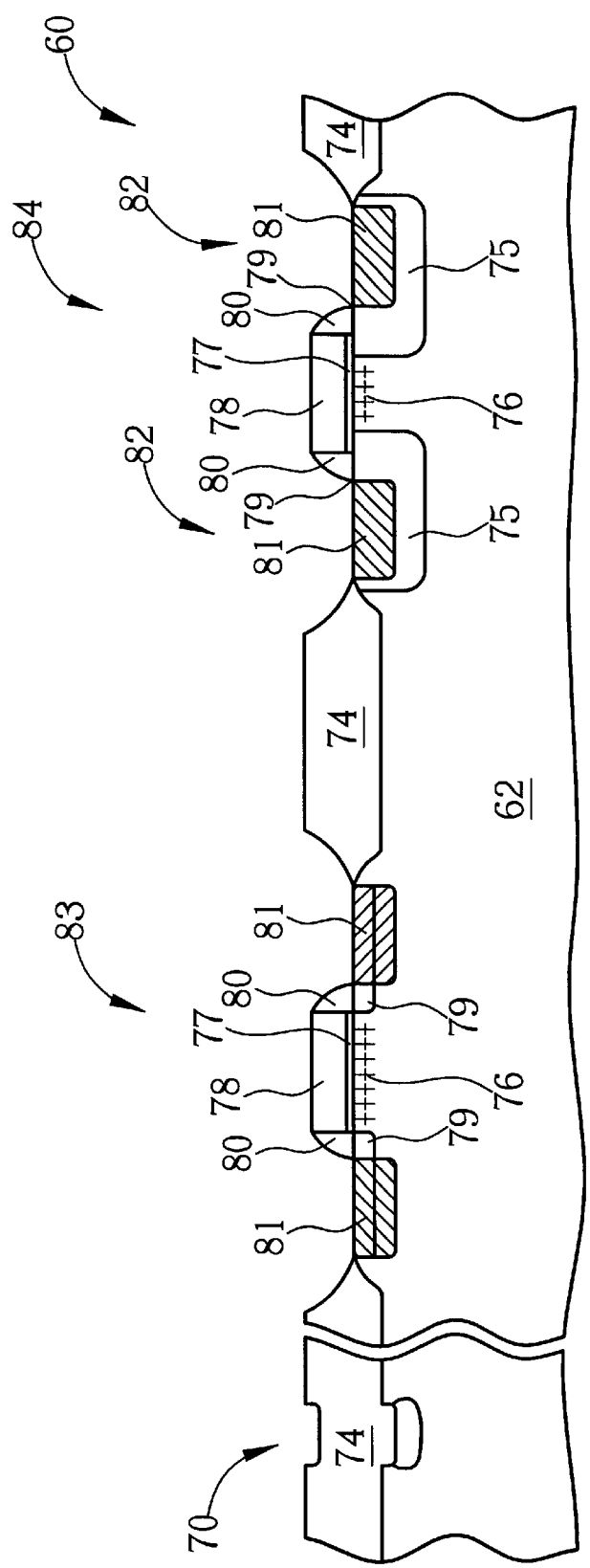

As shown in FIG. 9, spacers 80 are then formed around the poly gate 78 to provide insulation between the poly gate 78 and other devices, and to serve as masks in the subsequent ion implantation process. The ion implantation process is performed with an energy of 80 KeV to implant $5\times10^{15}$ ion/$cm^3$ of arsenic ions into the P-type silicon substrate 62 that is not covered by the poly gate 78, the spacers 80 or the field oxide layer 74 so as to form an $N^+$ doped region 81. The $N^-$ doped region 75 and the $N^+$ doped region 81 form a doped region 82 with a DDD. Finally, if required, an annealing process is performed to restore the silicon lattice in the silicon substrate 62.

Figure 10:
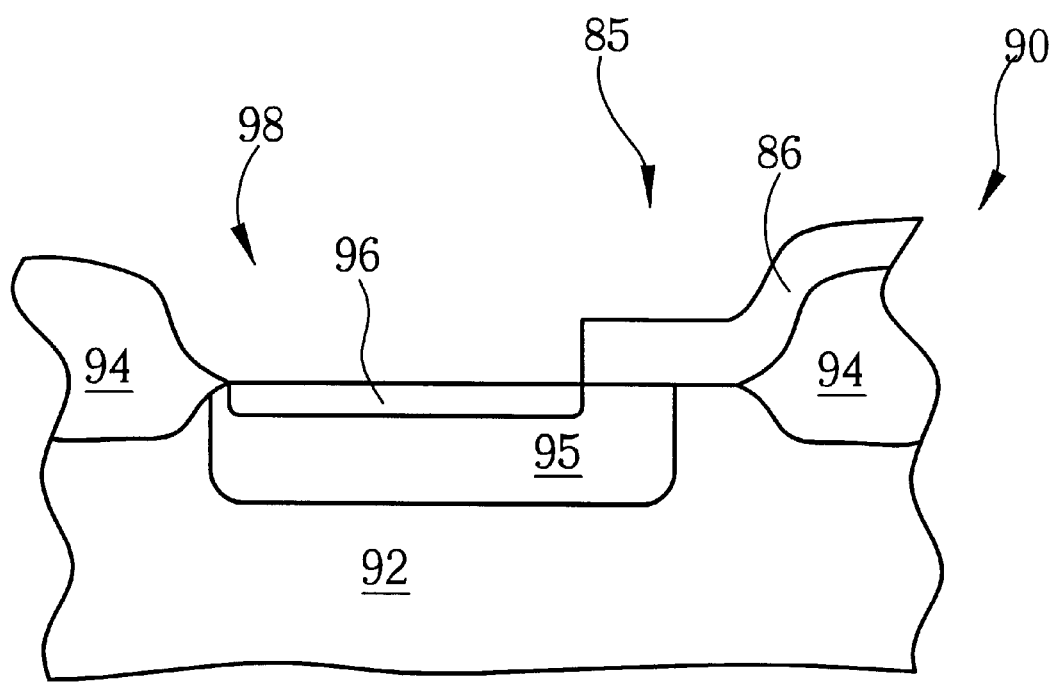
FIG. 10 is a cross-sectional diagram of an N-type lateral diffused MOS transistor formed on a semiconductor wafer according to the present invention.

FIG. 10 is a cross-sectional diagram of an N-type lateral diffused MOS transistor 85 formed on a semiconductor wafer 90 according to the present invention. The present invention method of forming the doped region with a DDD can also be applied in the formation of the LDMOS transistor 85. The LDMOS transistor 85 is formed on a substrate 92 positioned on the semiconductor wafer 90, and there is a field oxide layer 94 around the transistor 85. The LDMOS transistor 85 comprises a polysilicon electrode layer 86, an $N^-$ doped region 95 and an $N^+$ doped region 96. The $N^-$ doped region 95 and the $N^+$ doped region 96 form a doped region 98 with a DDD that is formed using the above-mentioned present invention method.

Also, if a P-type LDMOS transistor (not shown in figure) needs to be formed, or a P-type LVMOS transistor and a P-type HVMOS transistor need to be formed simultaneously, the process steps of the present invention method can still be used, but some conditions are replaced as follows: the P-type silicon substrate is replaced by an N-type silicon substrate (or an N-well is formed in the P-type silicon substrate). The phosphorus ions in the ion implantation process shown in FIG. 5 are replaced by boron (B) ions, wherein the implantation dosage is $4\times10^{13}$ ion/$cm^3$ the implantation energy is 160 KeV. The arsenic ions in the ion implantation process shown in FIG. 9 are replaced by $BF_2^+$ ions, wherein the dosage is $3\times10^{15}$ ion/$cm^3$ and the implantation energy is 60 KeV. With these substitutions, a P-type LDMOS transistor with a $P^-$ doped region and a $P^+$ doped region in it, or a plurality of P-type LVMOS transistors and P-type HVMOS transistors, can be formed using the same equipment.

The present invention method of forming a doped region with a DDD on a semiconductor wafer combines two thermal processes into one. This single thermal process both drives the ions into the substrate and also grows the field oxide layer. As a result, the present invention can both prevent an excessive thermal budget, which can result in instabilities in low voltage devices, and also integrates the processes of both HVMOS transistors and LVMOS transistors, which reduces production costs. In addition, the present invention can form a plurality of alignment marks on a semiconductor wafer to decrease the asymmetry of each step so as to promote the precision of the mask alignment process.

In contrast to the prior art method of forming the doped region on the semiconductor wafer, the present invention method not only combines two thermal processes into one to eliminate unnecessary thermal processes that may result in instabilities in the LVMOS transistors, but can also form a plurality of alignment marks on a semiconductor wafer to increase the precision of the mask alignment process.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of forming a high voltage metal-oxide semiconductor (HVMOS) transistor on a semiconductor wafer, the semiconductor wafer comprising a silicon substrate, a silicon oxide layer positioned on the silicon substrate, and a silicon nitride layer positioned on a predetermined area of the silicon oxide layer, the method comprising:

performing a lithographic process to form a photoresist layer on the semiconductor wafer, the photoresist layer being used as a mask and comprising at least an opening through to the surface of the silicon nitride layer;

performing a first ion implantation process to implant a first specific dosage of dopants into the silicon substrate under the opening;

removing the photoresist layer on the semiconductor wafer;

performing a thermal oxidation process to form a field oxide layer in the region not covered by the silicon nitride layer, and to simultaneously drive the dopants into the silicon substrate so as to form doped regions that are used as a source and a drain of the high voltage metal-oxide semiconductor (HVMOS) transistor;

removing the silicon nitride layer on the semiconductor wafer;

forming a gate on the silicon substrate between the two doped regions;

forming a spacer around the walls of the gate; and performing a second ion implantation process to implant a second specific dosage of dopants into the two doped regions so as to cause the two doped regions to each have a double diffuse drain (DDD).

2. The method of claim 1 wherein the silicon oxide layer comprises silicon dioxide ($SiO_2$) and is used as a pad oxide layer.

3. The method of claim 1 wherein the silicon nitride layer comprises silicon nitride (SiN) and is used to define an active area on the semiconductor wafer.

4. The method of claim 1 wherein the photoresist layer formed by the lithographic process also covers a scribe line on the semiconductor wafer, and the photoresist layer on the scribe line comprises at least an opening to define a position of an alignment mark, the method comprising:

performing an etching process through the opening in the photoresist layer to form a recess at the scribe line defines the alignment mark.

5. The method of claim 1 wherein the thermal oxidation process is performed in the presence of oxygen gas at 1000 to 1100° C. for 30 to 60 minutes.

6. The method of claim 1 wherein the HVMOS transistor is an N-type MOS transistor, and the dosage and the energy in the second ion implantation process are $5 \times 10^{15}$ ion/cm$^3$ of arsenic ions and 80 KeV, respectively.

7. The method of claim 1 wherein the HVMOS transistor is a P-type transistor, and the dosage and the energy in the second ion implantation process are $3 \times 10^{15}$ ion/cm$^3$ of $BF_2^+$ ions and 60 KeV, respectively.

8. The method of claim 6 wherein the dosage and the energy in the first ion implantation process are $5 \times 10^{13}$ ion/cm$^3$ and 320 KeV, respectively.

9. The method of claim 7 wherein the dosage and the energy in the first ion implantation process are $4 \times 10^3$ ion/cm$^3$ and 160 KeV, respectively.

10. The method of claim 1 wherein the doped regions are used to form a conductive area in a lateral diffused metal-oxide semiconductor (LD MOS) transistor.

* * * * *